United States Patent [19]

Brunsvold et al.

[11] Patent Number: 5,164,278
[45] Date of Patent: Nov. 17, 1992

[54] SPEED ENHANCERS FOR ACID SENSITIZED RESISTS

[75] Inventors: William R. Brunsvold, Poughkeepsie; Christopher J. Knors, Wappingers Falls; Melvin W. Montgomery, New Windsor; Wayne M. Moreau; Kevin M. Welsh, both of Wappingers Falls, all of N.Y.

[73] Assignee: International Business Machines Corporation, Armonk, N.Y.

[21] Appl. No.: 487,348

[22] Filed: Mar. 1, 1990

[51] Int. Cl.$^5$ .................. G03F 7/021; G03F 7/038
[52] U.S. Cl. ................................. 430/176; 430/270; 430/914; 430/918; 522/15; 522/25; 522/31; 522/32
[58] Field of Search .............. 430/270, 176, 914, 918; 522/15, 25, 31, 32

[56] References Cited

U.S. PATENT DOCUMENTS

| | | | |
|---|---|---|---|
| 4,311,782 | 1/1982 | Buhr et al. | 430/270 |
| 4,442,197 | 4/1984 | Crivello et al. | 430/914 X |
| 4,506,003 | 3/1985 | Ruckert et al. | 430/270 |
| 4,678,737 | 7/1987 | Schneller et al. | 430/176 |
| 4,868,092 | 9/1989 | Kawabata et al. | 522/15 X |
| 4,994,346 | 2/1991 | Meier et al. | 430/914 X |

FOREIGN PATENT DOCUMENTS 63-97944  4/1988  Japan ................................. 430/176

OTHER PUBLICATIONS

English translation of 63-97944 (Konishiroku) Japan.

*Primary Examiner*—Cynthia Hamilton
*Attorney, Agent, or Firm*—John A. Stemwedel; Dale M. Crockatt

[57] ABSTRACT

Acid sensitized photoresists with enhanced photospeed are provided. The photoresist compositions include a polymer binder and/or a polymerizable compound and an acid sensitive group which enables patterning of the resist composition, and acid generating photoinitiator, and an hydroxy aromatic compound which enhances the speed of the resist composition under imaging radiation.

23 Claims, No Drawings

SPEED ENHANCERS FOR ACID SENSITIZED RESISTS

DESCRIPTION

1. Field of Invention

The present invention provides acid sensitized resist compositions comprising an acid generating photoinitiator, a polymeric binder and/or a polymerizable compound and an acid sensitive group which enables patterning of the resist composition and an hydroxy aromatic compound which enhances the speed of the resist composition under imaging radiation. These compositions are particularly useful in that they exhibit increased speed when exposed with deep UV, x-ray or E-beam radiation.

2. Background of Art

In this application, the terms "resist" and "photoresist" are used interchangeably as is understood in the art to refer to compositions which are useful in transferring images in a positive or a negative tone in processes which comprise the application of a film of the composition to a substrate, subjecting the film of the composition to a patterned exposure with an imaging radiation, developing the imaged film of the composition in order to form patterns, and using the patterns formed to assist in the further processing on the substrate with chemical or physical processes. Resist use and processing is a very important aspect in the manufacture of semiconductor products.

The use of acid sensitive resist compositions is well known in the art. Such compositions depend upon the action of an acid generating photoinitiator to cause a chemical change in the resist composition. The acid induced change may be in the form of a degradation or an aggregation reaction. Acid initiated photochemical reactions may be either positive tone or negative tone; they may involve a cross-linking reaction or a degradation or scission reaction. The reactions may further be chemically amplified or non-amplified. By chemically amplified, it is meant that the quantum yield of the reaction is greater than 1, preferably from 10–100, whereas a non-amplified system has a quantum yield that cannot exceed 1 and usually is significantly less than 1. Thus, in a chemically amplified system, each proton generated will lead to several acid induced events, while in a non-amplified system, no more than one acid induced event per proton will occur.

Examples of negative working systems that operate by means of an acid initiated process include two or three component systems where there is provided a cross-linkable polymeric binder or a polymerizable monomer, a cross-linking agent either on the cross-linkable binder or as a separate compound, and a compound which generates acid upon exposure to actinic radiation.

In U.S. Pat. No. 4,108,747, certain curable compositions which are polymerizable under UV radiation are disclosed. Among the polymerizable materials are oxirane containing organic resins such as epoxy novolaks, epoxy siloxane resins, epoxy polyurethanes, and epoxy polyesters, and vinyl organic monomers which are compatible with thermoplastic polymers such as styrene, vinyl acetamide, alpha-methyl styrene, isobutyl vinylether, n-octyl vinylether, acrolein, 1,1-diphenylethylene, beta-pinene, vinyl arenes such as 4-vinyl biphenyl, 1-vinyl pyrene, 2-vinyl fluorene, acenaphthalene, 1- and 2-vinyl naphthalene, N-vinyl carbazole, N-vinyl pyrrolidone, 3-methyl-1-butene, vinyl cycloaliphatics such as vinylcyclohexane, vinylcyclopropane, 1-phenylvinylcyclopropane, isobutylene, and dienes such as isoprene, butadiene, 1,4-pentadiene, etc. Additional organic materials which can be used to make the polymerizable compositions are cyclic ethers, for example, oxetanes such as 3,3-bischloromethyloxetane, alkoxyoxetanes, oxolanes such a tetrahydrofuran, oxepanes, oxygen containing spiro compounds, trioxane, dioxolane, etc. Cyclic esters such as beta-lactones, for example, propiolactone, cyclic amines such as 1,3,3-trimethylazetidine and organosilicon cyclics such as hexamethyl trisiloxane, octamethyl tetrasiloxane may be used as well. The photoinitiators disclosed are photosensitive trifluoromethane onium salts selected from

$$[(R)_a(R^1)_b(R^2)_cS]^+[XSO_3]^-, \qquad (1)$$

$$[(R^3)_d(R^4)_eI]^+[XSO_3]^- \qquad (2)$$

can be used to effect the cationic polymerization of a variety of cationically polymerizable monomers by exposure to UV irradiation followed by thermal treatment at temperatures significantly less than 300° F., where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, $R^3$ is selected from radicals and $R^4$ is selected from divalent aromatic radicals, a is a whole number equal to 0 to 3 inclusive, b is a whole number equal to 0 or 2 inclusive, c is a whole number equal to 0 or 1, where the sum of a+b+c is a value equal to 3, d is a whole number equal to 1 or 2, e is 0 or 1 and d+e is equal to 2 and X is a member selected from $C_{(6-13)}$ aromatic hydrocarbon radicals, $C_{(1-3)}$ alkyl radicals, halogenated derivatives thereof and fluorine.

Radicals included by X are more particularly aryl radicals, such as phenyl, tolyl, xylyl, etc.; haloaryl, such as chlorophenyl, fluorotolyl, etc.; alkyl radicals, such as methyl, ethyl, propyl, etc.; haloalkyl, such as trifluoromethyl, $C_3F_7$--, $C_4F_{17}$--, $C_4F_9$--, etc., etc.

Schlesinger, Sci. Eng. 18, pp. 387 et. seq. (1974) discloses the use of various aryl diazonium salts as initiators for the photopolymerization or crosslinking of epoxides. The aryl group may be extensively substituted. The anions include (but are not limited to) hexafluorophosphate, hexafluoroarsenate, hexafluoroantimonate, tetrafluorostannate, tetrafluorobromate, hexachlorostanate, tetrachloroferrate(III), pentachlorobismuthate(III).

In U.S. Pat. No. 4,371,605 there are disclosed photopolymerizable compositions comprising a cationically polymerizable organic composition and a photoinitiator which is a N-hydroxyamide, or N-hydroxyimide, sulfonate. The cationically polymerized organic materials may be any of the well known materials such as are set forth in U.S. Pat. No. 4,108,747 and referred to above.

U.S. Pat. No. 4,245,029 discloses photopolymerizable compositions similar to those set forth in U.S. Pat. No. 4,108,747, but wherein the acid generating compound is a triarylsulphonium salt wherein the anion is a metal or metalloid halo complex. The metals are selected from the group consisting of antimony, iron, tin, bismuth, aluminum, gallium, indium, titanium, zirconium, scandium, vanadium, chromium, manganese, cesium and the rare earth elements such as the lanthanides and actinides and metalloids may be boron, phosphorous, arsenic, etc.

Positive resist systems will typically resist a polymeric binder, and insolublizing agent and an acid generator. Such systems are generally made more soluble in exposed areas due to the action of the acid generating photoinitiator.

U.S. Pat. No. 4,734,481 is directed to organometallic polyphthalaldehyde compositions which are useful in dry developable photoresist compositions.

U.S. Pat. No. 4,689,288 is directed to photo sensitive films which can be converted into Bronsted acids. The compositions have polymers with organon-stable side chains. The organometallic side chain is removed from the aromatic ring by the action of the photoinitor. Typical organometallic materials include silicon, tin or germanium side chains having alkyl or aryl substituents.

U.S. Pat. No. 4,491,628 is directed to compositions which are positive or negative working depending upon the selection of the developer, which compositions comprise a polymer having a recurrent pendent group that undergoes efficient acidolysis to give a change in polarity (solubility) and an acid generating photoinitiator. The preferred pendent groups are tertbutyl esters of carboxilic acids and tertiary butyl carbonates of phenols. The acid generating compounds are metal and metalloid onium salts.

U.S. Pat. No. 4,603,101 is directed to still other photoresist compositions which may be developed in a positive or negative tone. These compositions comprise t-butylpolyaryl ethers and aromatic onium salts and are dependent upon the choice of solvent to generate the tone of the material. In view of the reaction products generated, it is believed that these photoresist compositions are not chemically amplified, that is, additional acid is not generated by the removal of the particular protecting groups.

U.S. Pat. No. 4,737,426 provides photoresist compositions comprising cyclic acetals or ketals of beta-keto esters or amides which decompose upon the reaction with acid from an acid generating photoinitiator. These compounds rely on polymer main chain scission to change to solubility of the polymer.

The first chemically amplified resists to give positive or negative tone images were based on the irradiation of onium salts which generate super acids in order to break chemical bonds and further generate acid by-products which may in turn break additional chemical bonds. This bond-breaking may involve a deprotection reaction, a main-chain bond-breaking or a ring opening reaction of, for example, an oxirane wherein an additional proton is generated and can cause the chemistry to continue to proceed. The onium salt compositions may be, for example, aryldiazonium salts, diaryliodinium salts or triarylsulphonium salts. These onium salts may have as preferred in ions, complex metalloid or metal halides such as tetrafluoroborate, hexafluorborate, hexafluoroantiminate or hexaflurophosphate. There has been a trend in the industry to develop other acid generating photoinitiators which are halometal and halometalloid free. These materials have been developed to avoid the use of antimony or arsenic containing compounds. Onium triflates have been found useful as have other non-onium, non-metallic acid generators which include oxime sulfonates, dicarboximide sulfonates, halotriazines, and 2,6-dinitrobenzyl sulfonates.

It is noted that such acid generators produce strong acids which are not nearly as strong as those generated by the halometal and halo metalloid onium salts (e.g., HSbF$_6$ or HAsF$_6$. The distinction between superacids and strong acids herein is that super acids generally have a pKa of less than about −12 whereas strong acids have pKa from −12 to 1. Thus there has been a need for higher loading of non-metallic and non-metalloid acid generators in order to achieve the equivalent sensitivity and resist performance that has come to be expected with similar resist compositions which contain a halo metal or metalloid onium salt acid generator.

The use of aromatic compounds to photosensitize onium salts is well documented. Recently, dicarboximide sulfonates and N-acylphthalimides have been sensitized to 300-450 nm light. The sensitizers are usually polyaromatic compounds such as substituted anthracene or pyrene derivatives that have reasonable absorbance in the mid and near UV regions. However, these sensitizers do not function well in deep UV region due to large extinction coefficients at 248 nm that lead to excessively high absorption in resist films.

Chemically amplified photoresist compositions comprising a polyeric or molecular composition having a solubility determining functionality protected by an acid labile group and a radiation sensitive sulfonic acid precursor are disclosed in patent application U.S. Ser. No. 322,848, filed Mar. 14, 1989 and assigned to the assignee of the present invention. The preferred sulfonic acid precursors are sulfonyl oxyimides having the structural formula

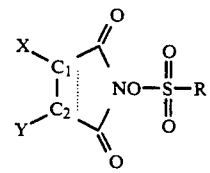

(I)

wherein R is selected from the group consisting of —CF$_3$, —CF$_2$CF$_3$ —CF$_2$CF$_2$H, —(CF$_2$)—Z$_n$ where n=1 to 4, where Z is H, alkyl or aryl,

(II)

(III)

where m is from 1 to 5, and where X and Y (1) form a cyclic or polycyclic ring which may contain one or more hetero atoms, (2) form a fused aromatic ring, (3) may be independently H, alkyl or aryl, (4) may be attached to another sulfonyoxyimide containing residue, or (5) may be attached to a polymeric chain or backbone.

IBM Technical Disclosure Bulletin, Vol. 18, No. 6, p. 1775, November 1975, discloses the use of hydroquinone with AZ 1350J resist which is believed to be essentially a novolak resin having a photosensitive o-diazonaphthoquinone which functions as a dissolution inhibitor. The hydroquinone additive is merely a dissolution enhancer.

U.S. Pat. No. 4,202,742 discloses the use of parabenzoquinone and hydroquinone, normally polymerization inhibitors, to initiate the polymerization of ethylenenically unsaturated monomers. The compositions are activated by other than ultraviolet light.

U.S. Pat. No. 4,800,152 discloses negative resist compositions (2 or 3 component systems) wherein an onium salt initiates a carbonium ion from an activated aromatic compound consisting of poly(vinylbenzylacetate) and trisacetoxy mesitylene.

SUMMARY OF THE INVENTION

It has been surprisingly found that the sensitivity of chemically initiated photoresist compositions, that is, resists which depend on an acid initiated mechanism, which have a compound which generates a strong acid or super acid upon exposure to ectimic radiation may be greatly enhanced by the addition of certain hydroxy aromatic compounds to the resist composition. These hydroxy aromatic compounds include hydroquinone, pyrogallol, 4-hydroxyacetophenone, Bisphenol A, 3,5-di-$t$-butyl-4-cresol and hydroxy substituted naphthalenes. These hydroxy aromatic compounds appear to function to permit the acid generating photoinitiators in said compounds to greatly increase the output of acid generated. This, in turn, results to increased photospeed and tool throughput.

DETAILED DESCRIPTION

In accordance with the present invention, acid initiated photoresist compositions with enhanced photospeed are provided which comprise an acid generating photoinitiator, a polymer binder or matrix, an acid sensitive group which enables patterning of the composition by an acid initiated chemical reaction, and a sufficient amount of hydroxy aromatic compound which enhances the speed of the resist composition under imaging radiation.

It has been found that the addition of from 1 to 5 percent by weight of a hydroxy aromatic compound to an acid initiated photoresist composition will provide significant improvements in photospeed. These compounds will take the form

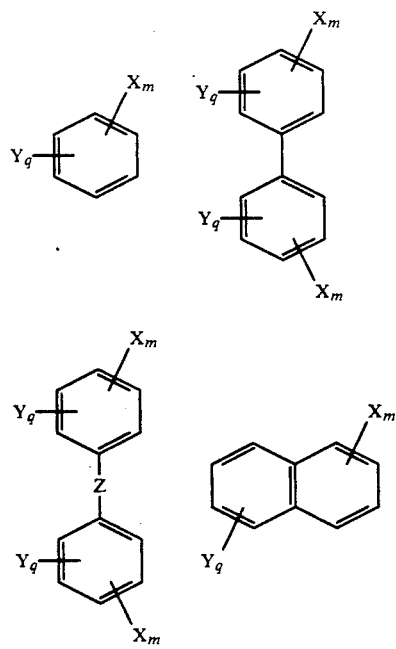

where X is an OH group and m is an integer equal to one or more, Y is an alkyl, aryl, alkoxy, halo or acetyl group and q is an integer equal to one or more, and Z is $-O-$, $-S-$, $-C_nH_{2n}-$, or $-C_nF_{2n}-$ where n is an integer from 1 to 12. Polymeric materials which may be used and which must be different from the polymeric binder in the photoresist composition include novolaks and polyhydroxystyrene of the form

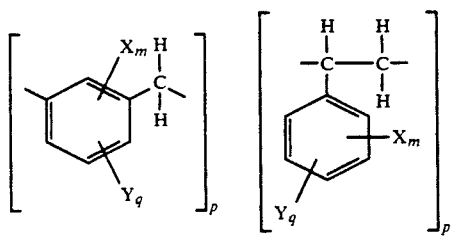

where X and Y are the same as defined above. No more than 3% of such polymeric enhancer may be included in the composition. The enhancer must be selected for having a low extinction coefficient so that it does not absorb the imaging actinic radiation.

The most preferred speed enhance compounds include hydroquinone, pyrogallol, 4-hydroxyacetophenone, Bisphenol A, 3,5-di-$t$-butyl-4-cresol and dishydroxy substituted naphthalenes.

While the mechanism of speed enhancement has not been determined, it is believed that hydroxy aromatic compound disassociates to donate a proton under the influence of the Lewis acid that is generated by the action of actinic radiation on the photoinitiator.

Typical photoresist compositions will have up to about 25% solids and will be predominately polymeric binder about 20% and will have about 5-10% of that amount, that is, 1-3% acid generating photoinitiator. We have found that the addition of 5-15% of hydroxy gives enhanced photospeed and sensitivity which permits metal and metalloid onium salts to be used at high through put rates and permits the use of non-metal and non-metallic onium salt and non-onium salt acid generators to be used as photoinitiators with reasonable photospeed.

EXAMPLE 1

A photoresist composition containing 4 weight percent of N-hydroxyphthalimide tosylate and 20 weight percent of poly-$t$-butyloxycarbonyloxystyrene and propylene glycol methyl ether acetate to 100 weight percent were prepared. Comparative formulations were prepared without any additives and using 2 weight percent of the following materials: (A) hydroquinone; (B) 4-hydroxy acetophenone; (C) Bisphenol A; (D) 3,5-di-$t$-butyl cresol; (E) 1,4-dihydroxynaphthalene; (F) 1,4-dimethoxy benzene; (G) 1,2,4-trihydroxybenzophenone. Wafers were coated with the control formulation and formulations containing additives (A) through (G) to form films 0.95-1.0 μm thick on silicon wafers. The wafers were prebaked at 90° C. for 1 minute and then were exposed on a Perkin Elmer 500 (in UV-2 mode) at 240-280 nm. The exposed wafers were baked at 90° C. for 90 seconds and were developed in isopropanol/anisole mixtures as shown in Table I to determine dose-to-clear. Unexposed film thinning values as measured on NANOSPEC is also shown.

TABLE I

| Additive | Dose to Clear | Unexposed Thinning | Developer |
|---|---|---|---|
| Control | >120 mj/cm² | 550A | 5% anisole/IPA |
| A | 12 mj/cm² | 620A | " |
| B | 14 mj/cm² | 910A | " |
| C | 12 mj/cm² | 2200A | " |
| D | 44 mj/cm² | 720A | IPA |
| E | 15 mj/cm² | 760A | 5% anisole/IPA |
| F | >120 mj/cm² | 220A | IPA |
| G | >120 mj/cm² | 2300A | 5% anisole/IPA |

With additives D and F excessive thinning in the anisole/isopropanol developer was experienced and the developer was changed to pure isopropanol in order to retard unexposed thinning. The preferred additives are hydroquinone, 1,4-dihydroxynaphthalene(the naphthalene analog of hydroquinone) and 4 hydroxyacetophenone. These additives provided a significant increase in photospeed over the control without causing an unreasonable, unexposed thinning of the resist. The lack of hydroxyl groups in 1,4-imethoxy benzene and the absorbing carbonyl group in 1,2,4-trihydroxybenzophenone are believed responsible for their inferior performance.

EXAMPLE 2

Additional photoresist formulations were prepared to demonstrate the efficacy of the use of hydroquinone as a sensitivity enhancer in chemically amplified photoresist compositions. Such formulations were prepared both with and without hydroquinone to show the functional improvements. The formulations comprised 20% by weight of poly-$t$-butyloxycarbonyloxystyrene 1-3% by weight sensitizer, and sufficient propylene glycol methyl ether acetate solvent to bring the composition to 100%. The sensitizers were (H) triphenylsulfonium hexafluoroantimonate, (I) N-trifluoromethylsulfonyloxyphthalimide, (J) 4-methyl-phenylsulfonyloxybicyclo[2.2.1]hept-5-ene-2,3-dicarboximide, and (K) 4-chlorophenylsulfonyloxybicyclo[2.2.1]hept-5-ene-2,3-dicarboximide. Table II shows the dose-to-clear with no additive and with 2% additive for each formulation.

TABLE II

| Photoacid Generator | Wt. | Dose to Clear No additive | Dose to Clear 2% Hydroquinone |
|---|---|---|---|
| H | 1% | 5 mj/cm² | 2.5 mj/cm² |
| I | 3% | 50 mj/cm² | 30 mj/cm² |
| J | 3% | 55 mj/cm² | 28 mj/cm² |
| K | 3% | 60 mj/cm² | 40 mj/cm² |

Significant increases in the photospeed of each composition was observed when 2% hydroquinone was included as a speed enhancing additive.

EXAMPLE 3

Another group of resist formulations were prepared for comparative testing as follows: (L) a composition comprising 20% by weight of a poly(4-$t$-butyloxycarbonyloxystyrene-co-4-hydroxystyrene), 2% by weight of a N-trifluoromethylsulfonyloxybicyclo[2.2.1]hept-5-ene-2,3-dicarboximide, and a propylene glycol methyl ether acetate casting solvent. To a portion of the composition L formulations 2% by weight hydroquinone was added and different exposure media were used to determine comparative benefit as is shown in Table III.

TABLE III

| Resist Polymer | Additive | Exposure Medium | Exposure Dose |
|---|---|---|---|
| L | 0% | X-ray | 70-90 mj/cm2 |
| L | 2% | X-ray | 15-25 mj/cm2 |
| L | 0% | UV (254 nm) | 4-6 mj/cm2 |
| L | 2% | UV (254 nm) | 2-3 mj/cm2 |
| L | 0% | E-beam | 5 uC/cm2 |
| L | 2% | E-beam | 2.5 uC/cm2 |

These experiments show that improved "photospeed" was achieved in deep UV, e-beam and X-ray exposure.

EXAMPLE 4

Another resist formulation was prepared for comparative testing of potential additives as follows: (M) a composition comprising 20% by weight of a poly-4-$t$-butyloxycarbonyloxystyrene, 2% by weight of a N-trifluoromethylsulfonyloxybicyclo-[2.2.1]hept-5-ene-2,3-dicarboximide, and a propylene glycol methyl ether acetate casting solvent. To portions of this resist composition additives were prepared as follows: (N) hydroquinone, (0) pyrogallol, (P) benzophenone, and (Q) novolak resin. Table IV shows the changes in sensitivity from the additive-free control in exposure in UV (254 nm).

TABLE 4

| Resist Formulation | Additive | Additive Loading | Exposure Dose |
|---|---|---|---|
| M | Control | None | 3 mj/cm2 |
| M | N | 2% | 0.5 mj/cm2 |
| M | O | 2% | 1 mj/cm2 |
| M | P | 2% | no image |
| M | Q | 2% | 2.5 mj/cm2 |

These experiments show that the pressure of hydroxyl groups on an additive enhances photospeed.

EXAMPLE 5

A photoresist composition containing 1 weight percent of triphenylsulfonium triflate and 20 weight percent of poly-$t$-butyloxycarbonyloxystyrene polymer and sufficient percent propylene glycol methyl ether acetate to 100 were prepared. Comparative formulations were prepared without any additives and using the following materials: (A) hydroquinone; (C) Bisphenol A; (D) 3,5-di-$t$-butyl-4-cresol; (E) dihydroxynaphthalene; (F) 1,4-dimethoxy benzene. Wafers were coated with the control formulation and formulations containing additives (A) and (C) through (F) to form films 0.95-1.0 μm thick on silicon wafers. The wafers were prebaked at 90° C. for 1 minute and then were exposed on a Perkin Elmer 500 (in UV-2 mode) at 240-280 nm. The exposed wafers were baked at 90° C. for 90 seconds and were developed in isopropanol/anisole mixtures as shown in Table V to determine dose-to-clear. Film thinning values as measured on NANOSPEC are also shown.

TABLE 5

| Additive | Dose-to-Clear | Unexposed Thinning | Developer |
|---|---|---|---|
| Control | 1.9 mj/cm² | 210A | 5% anisole/IPA |
| A | 0.8 mj/cm² | 60A | 20% H₂O/IPA |
| C | 0.8 mj/cm² | 1280A | 20% H₂O/IPA |
| D | 1.9 mj/cm² | 180A | 5% anisole/IPA |
| E | >3 mj/cm² | 450A | 5% anisole/IPA |

TABLE 5-continued

| Additive | Dose-to-Clear | Unexposed Thinning | Developer |
|---|---|---|---|
| F | 1.5 mj/cm$^2$ | 110A | 5% anisole/IPA |

EXAMPLE 6

Resist formulations adapted for exposure on an X-ray tool were prepared as follows: (R) a composition comprising 20% by weight of a poly(4-t-butyloxy carbonyloxystyrene-co-4-hydroxystyrene), 1% by weight of a triphenylsulfonium hexafluoro- antimonate sensitizer, and a propylene glycol methyl ether acetate casting solvent. A portion of this formulation had 2% by weight of hydroquinone added to it. The resist formulations were spun to form films 0.95-1.0 μm thick on silicon wafers. The wafers were prebaked at 90° C. for 1 minute and then were exposed with and X-ray source. The exposed wafers were baked at 90° C. for 90 seconds and were developed in tetramethyl ammonium hydroxide as shown in Table VI to determine dose-to-clear.

TABLE 6

| Resist Formulation | Additive Loading | Exposure Dose |
|---|---|---|
| R | None | 45 mj/cm2 |
| R | 2% | 10 mj/cm2 |

EXAMPLE 7

A negative working deep UV resist formulation was prepared from an epoxy novolak resin and was sensitized with onium salt, samples were made with and without the use of the hydroquinone additive. The compositions were as follows:

TABLE 7

|  | Without Hydroquinone | With Hydroquinone |
|---|---|---|
| Quatrex 3710 Epoxy novolak resin | 20% | 20% |
| Triphenylsulfonium triflate | 2% | 2% |
| Diglyme | 78% | 75.5% |
| Hydroquinone | 0% | 2.5% |

The formulations were case onto silicon wafers in films about 0.9 μm thick. The coated wafers were prebaked at 90° C. for 2 min. and the wafers were exposed with 254 nm deep UV radiation. The exposed wafers were then baked at 95° C. for 2 min. and developed with n-butyl acetate. The results of such treatment are shown in Table 8.

TABLE 8

| Dose to form 0.9 μm images | |
|---|---|
| Without Hydroquinone | With Hydroquinone |
| 27 mj/cm$^2$ | 12 mj/cm$^2$ |

It can be seen that the effective photospeed of this negative resist is increased by a factor of more than 2 when using the hydroquinone additive.

While the present invention has been described in terms of certain preferred embodiments, and exemplified with respect thereto, one skilled in the art will readily appreciate that various modifications, changes, omissions and substitutions may be made without departing from the spirit thereof. It is intended, therefore, that the present invention be limited solely by the scope of the following claims.

We claim:

1. A negative working acid initiated photoresist composition comprising from 1 to 5 weight percent of an acid generating photoinitiator, from 15 to 25 weight percent of a polymer binder or matrix, an acid sensitive group which enables patterning of the composition by an acid initiated chemical reaction, from 1 to 5 weight percent of a hydroxy aromatic compound which is sufficient to enhance the photospeed of the resist composition under imaging radiation, and an organic solvent for the photoresist solids.

2. The negative working acid initiated photoresist composition of claim 1 wherein the acid generating photoinitiator is selected from the group consisting of metal onium salts, metalloid onium salts, non-metal/-non-metalloid onium salts, and non-onium salt acid generators.

3. The negative working acid initiated photoresist composition of claim 2 wherein the metal onium salt is selected from the group consisting of aryl diazonium, aryl iodonium and aryl sulfonium salts wherein the anion is a metal halide.

4. The negative working acid initiated photoresist composition of claim 2 wherein the metalloid onium salt is selected from the group consisting of aryl diazonium, aryl iodonium and aryl sulfonium salts wherein the anion is a metalloid halide.

5. The negative working acid initiated photoresist composition of claim 2 wherein the non-metal, non-metallic onium salt is selected from the group consisting of aryl diazonium, aryl iodinium and aryl sulfonium salts wherein the anions is a triflate, sulfonate carboxylate or carbonate.

6. The negative working acid initiated photoresist composition of claim 2 wherein the non-onium salt acid generator is an oxime sulfonate, a dicarboximide sulfonate, a halotriazine, or a 2,6-dinitrobenzyl sulfonate.

7. The negative working acid initiated photoresist composition of claim 1 wherein the hydroxy aromatic compound is a polymer present in an amount up to 3% by weight of the composition.

8. The negative working acid initiated photoresist composition of claim 7 wherein the polymer is a novolak or poly hydroxy styrene of the form

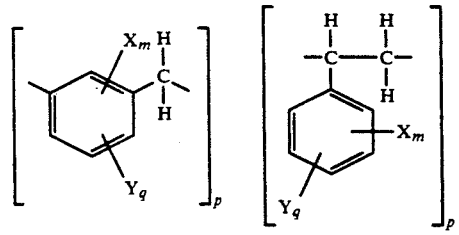

where X is an OH group and m is an integer equal to one or more and Y is an alkyl, aryl, alkoxy, halo, or acetyl group and q is an integer equal to one or more.

9. The negative working acid initiated photoresist composition of claim 1 wherein the hydroxyaromatic compound is of the form

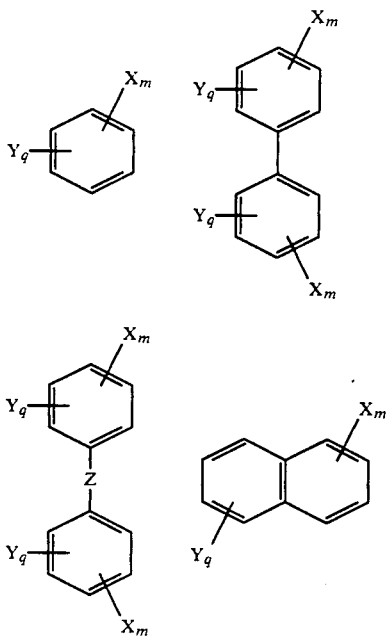

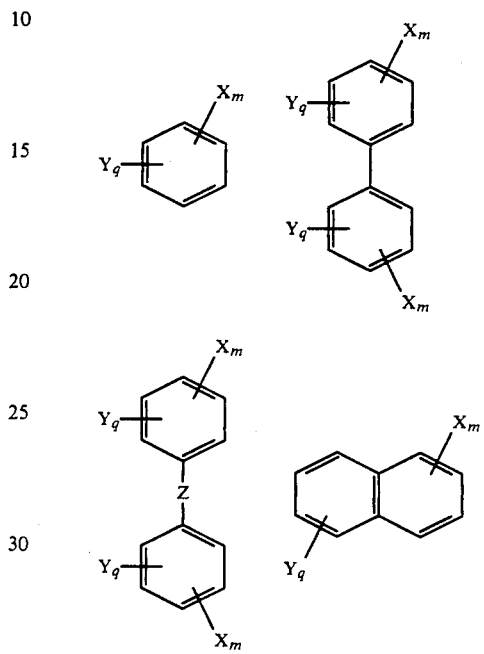

where X is an OH group and m is an integer equal to one or more, Y is an alkyl, aryl, alkoxy, hal, or acetyl group and q is an integer equal to one or more, and Z is $-O-$, $-S-$, $-C_2H_{2n}-$, or $-C_2F_{2n}-$ where n is an integer from 1-12.

10. An acid initiated photoresist composition comprising from 1 to 5 weight percent of an acid generating photoinitiator, from 15 to 25 weight percent of a polymer binder or matrix, an acid sensitive group which enables patterning of the composition by an acid initiated chemical reaction, from 1 to 5 weight percent of a hydroxy aromatic compound selected from the group consisting of hydroquinone, pyrogallol, 4-hydroxyacetophenone, Bisphenol A, and 3,5-di-t-butyl-4-cresol which is sufficient to enhance the photospeed of the resist composition under imaging radiation, and an organic solvent for the photoresist solids.

11. The acid initiated photoresist composition of claim 10 wherein the acid generating photoinitiator is selected from the group consisting of metal onium salts, metalloid onium salts, non-metal/non-metalloid onium salts, and non-onium salt acid generators.

12. The acid initiated photoresist composition of claim 11 wherein the metal onium salt is selected from the group consisting of aryl diazonium, aryl iodonium and aryl sulfonium salts wherein the anion is a metal halide.

13. The acid initiated photoresist composition of claim 11 wherein the metalloid onium salt is selected from the group consisting of aryl diazonium, aryl iodonium and aryl sulfonium salts wherein the anion is a metalloid halide.

14. The acid initiated photoresist composition of claim 11 wherein the non-metal, non-metallic onium salt is selected from the group consisting of aryl diazonium, aryl iodinium and aryl sulfonium salts wherein the anions is a triflate, sulfonate carboxylate or carbonate.

15. The acid initiated photoresist composition of claim 11 wherein the non-onium salt acid generator is an oxime sulfonate, a dicarboximide sulfonate, a halotriazine, or a 2,6-dinitrobenzyl sulfonate.

16. A positive working acid initiated photoresist composition comprising from 1 to 5 weight percent of an acid generating photoinitiator, from 15 to 25 weight percent of a polymeric binder or matrix, an acid sensitive group which enables patterning of the composition by an acid initiated chemical reaction, from 1 to 5 weight percent of a hydroxyaromatic compound of the form where X is an OH group and m is an integer equal to one or more, Y is an alkyl, aryl, alkoxy, halo, or acetyl group and q is an integer equal to one or more, and Z is $-O-$, $-S-$, $-C_nH_{2n}-$, or $-C_nF_{2n}-$ where n is an integer from 1-12, which is sufficient to enhance the photospeed of the resist composition under imaging radiation, and an organic solvent for the photoresist solids.

17. The positive working acid initiated photoresist composition of claim 16 wherein the acid generating photoinitiator is selected from the group consisting of metal onium salts, metalloid onium salts, non-metal/non-metalloid onium salts, and non-onium salt acid generators.

18. The positive working acid initiated photoresist composition of claim 17 wherein the metal onium salt is selected from the group consisting of aryl diazonium, aryl iodonium and aryl sulfonium salts wherein the anion is a metal halide.

19. The positive working acid initiated photoresist composition of claim 17 wherein the metalloid onium salt is selected from the group consisting of aryl diazonium, aryl iodonium and aryl sulfonium salts wherein the anion is a metalloid halide.

20. The positive working acid initiated photoresist composition of claim 17 wherein the non-metal, nonmetallic onium salt is selected from the group consisting of aryl diazonium, aryl iodinium and aryl sulfonium salts wherein the anions is a triflate, sulfonate carboxylate or carbonate.

21. The positive working acid initiated photoresist composition of claim 17 wherein the non-onium salt acid generator is an oxime sulfonate, a dicarboximide sulfonate, a halotriazine, or a 2,6-dinitrobenzyl sulfonate.

22. The positive working acid initiated photoresist composition of claim 16 wherein the hydroxy aromatic compound is a polymer present in an amount up to 3% by weight of the composition.

23. The positive working acid initiated photoresist composition of claim 22 wherein the polymer is a novolak or polyhydroxystyrene of the form

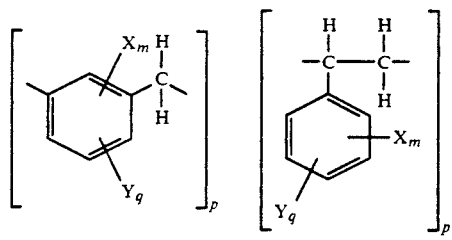

where X is an OH group and m is an integer equal to one or more and Y is an alkyl, aryl, alkoxy, halo, or acetyl group and q is an integer equal to one or more.

* * * * *